United States Patent
Asano et al.

(10) Patent No.: US 9,167,695 B2
(45) Date of Patent: Oct. 20, 2015

(54) ELECTRONIC DEVICE MODULE

(75) Inventors: Takuya Asano, Aichi (JP); Masaki Kondoh, Kanagawa (JP)

(73) Assignee: Japan Display Inc., Tokyo (JP)

( * ) Notice: Subject to any disclaimer, the term of this patent is extended or adjusted under 35 U.S.C. 154(b) by 735 days.

(21) Appl. No.: 13/459,768

(22) Filed: Apr. 30, 2012

(65) Prior Publication Data

US 2012/0293974 A1  Nov. 22, 2012

(30) Foreign Application Priority Data

May 17, 2011  (JP) ................................. 2011-110722

(51) Int. Cl.
*H05K 1/11* (2006.01)
*H05K 1/14* (2006.01)
*H05K 1/02* (2006.01)

(52) U.S. Cl.
CPC ................ *H05K 1/141* (2013.01); *H05K 1/144* (2013.01); *H05K 1/0269* (2013.01); *H05K 2201/09918* (2013.01)

(58) Field of Classification Search
CPC .................. H05K 1/0269; H05K 2201/09918; H05K 1/0266; H05K 1/141; H05K 1/144; H01L 2223/54426; H01L 23/544; G02F 2001/133354
USPC .................................. 361/784, 777, 779, 802
See application file for complete search history.

(56) References Cited

U.S. PATENT DOCUMENTS

| 7,450,296 B2 * | 11/2008 | Jang et al. ..................... 359/290 |
| 7,643,144 B2 * | 1/2010 | Okamuro et al. ............. 356/401 |
| 2008/0101048 A1 * | 5/2008 | Mishiro et al. ................ 361/784 |
| 2011/0121841 A1 * | 5/2011 | Chen ............................. 324/658 |

FOREIGN PATENT DOCUMENTS

| JP | 2004-317792 A | 11/2004 |
| JP | 2006-040978 A | 2/2006 |
| JP | 2006-119321 A | 5/2006 |
| JP | 2007-273578 A | 10/2007 |
| JP | 2008-010450 A | 1/2008 |
| JP | 2010-230808 A | 10/2010 |

* cited by examiner

*Primary Examiner* — Robert J Hoffberg
*Assistant Examiner* — Hung Dang
(74) *Attorney, Agent, or Firm* — Wolf, Greenfield & Sacks, P.C.

(57) ABSTRACT

An electronic device module includes a first substrate having a first wiring layer and a first alignment mark, the first alignment mark being transparent in a visible region of the electromagnetic spectrum, and a second substrate facing a part of the first substrate and having a second wiring layer and a second alignment mark facing the first alignment mark.

14 Claims, 15 Drawing Sheets

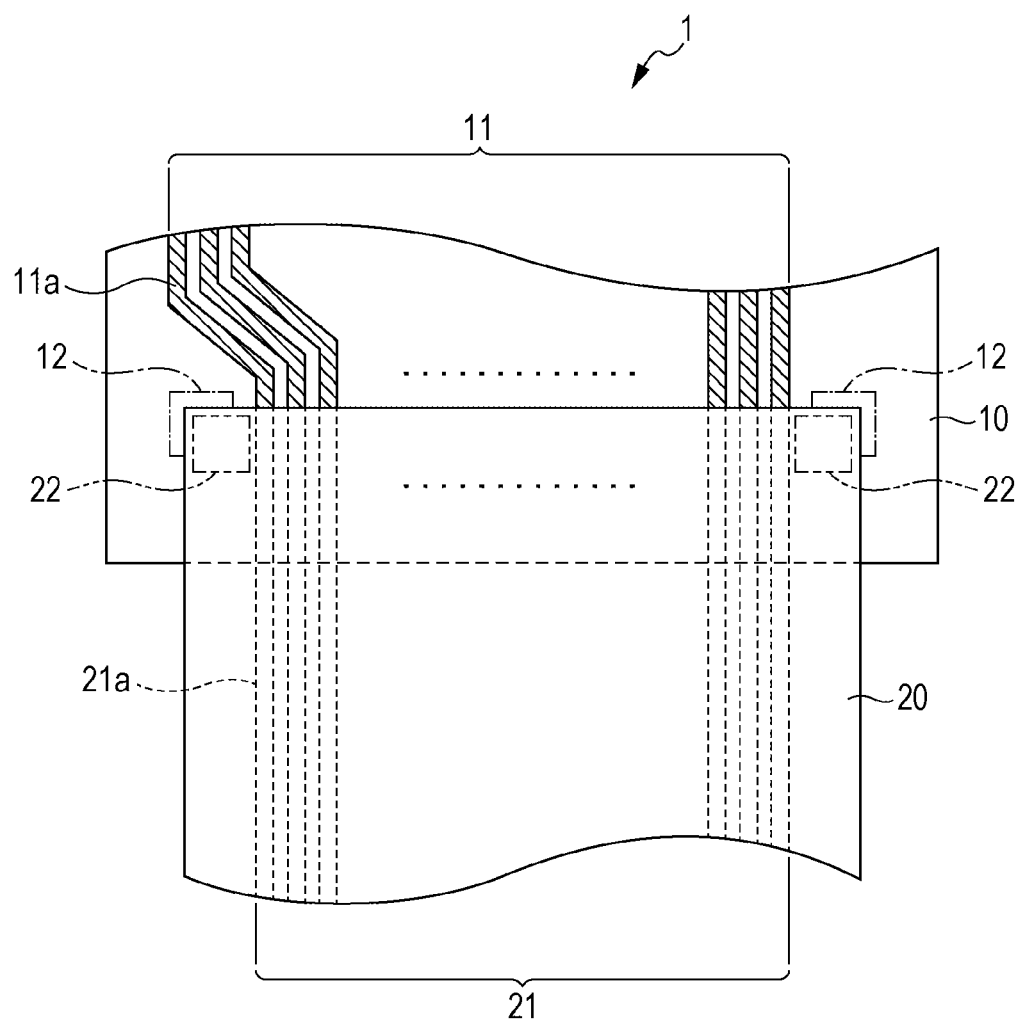

FIG. 20A
FIG. 20B
FIG. 20F
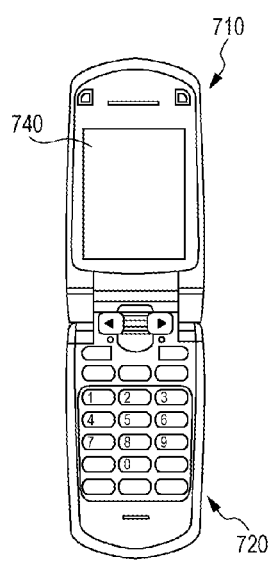
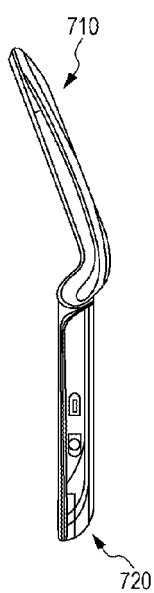
FIG. 20D FIG. 20C FIG. 20E
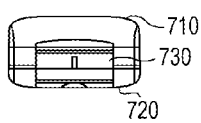
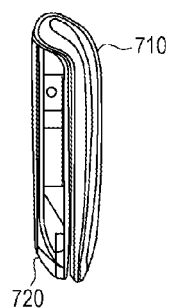
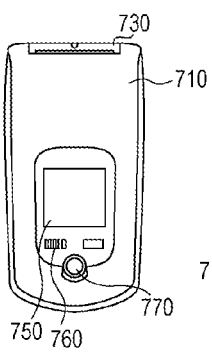
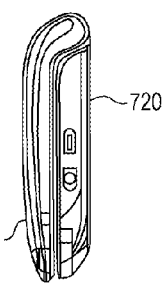
FIG. 20G
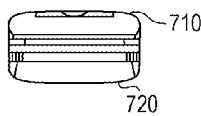

ELECTRONIC DEVICE MODULE

BACKGROUND

The present disclosure relates to an electronic device module having electronic components mounted using a printed board, etc., for example.

In display devices such as liquid crystal display devices and organic electroluminescent (referred to hereinafter as EL) devices, a printed board (PWB, PCB) is bonded to a panel (more specifically, a part of a substrate forming the panel) to mount an integrated circuit and other electronic components.

At the time of mounting, the printed board is positioned on the panel by aligning the alignment marks provided on the printed board with the alignment marks provided on the panel and then connected to the panel (see Japanese Unexamined Patent Application Publication Nos. 2010-230808 and 2006-119321, for example).

SUMMARY

In the alignment techniques described in Japanese Unexamined Patent Application Publication Nos. 2010-230808 and 2006-119321, both the alignment marks provided on the panel (more specifically, pixel driving substrate) and the alignment marks provided on the printed board are formed from a metal film that is opaque to visible light. At the time of mounting, the printed board is positioned on the panel such that the corresponding alignment marks are aligned with each other in face-to-face manner when the alignment marks are viewed through the printed board, for example.

Recently, alignment techniques have been becoming increasingly diversified and there is a demand for an alignment technique suitable for panels made of a transparent conductive film, such as touch panels, for example.

It is desirable to provide an electronic device module suitable for mounting electronic components on a panel made of a transparent conductive film.

An electronic device module according to an embodiment of the present disclosure includes a first substrate having a first wiring layer and a first alignment mark that is transparent in a visible region of the electromagnetic spectrum and a second substrate facing a part of the first substrate and having a second wiring layer and a second alignment mark facing the first alignment mark.

In the electronic device module according to this embodiment of the present disclosure, when the second substrate having the second wiring layer is mounted on the first substrate having the first wiring layer, the second substrate is aligned with the first substrate using the first transparent alignment mark and the second alignment mark.

The electronic device module according to this embodiment of the present disclosure allows the second substrate to be aligned with the first substrate by making use of the first transparent alignment mark. This makes it possible to realize an electronic device module suitable for mounting electronic components on a panel made of a transparent conductive film.

BRIEF DESCRIPTION OF THE DRAWINGS

FIG. 1 is a schematic plan view showing the configuration of main components of an electronic device module according to an embodiment of the present disclosure;

FIG. 20A is a front view of application 8 in opened state;

FIG. 20B is a side view of application 8 in opened state;

FIG. 20C is a front view of application 8 in closed state;

FIG. 20D is a left side view of application 8 in closed state;

FIG. 20E is a right side view of application 8 in closed state;

FIG. 20F is a top view of application 8 in closed state; and

FIG. 20G is a bottom view of application 8 in closed state.

DETAILED DESCRIPTION OF EMBODIMENTS

Figure 2A:
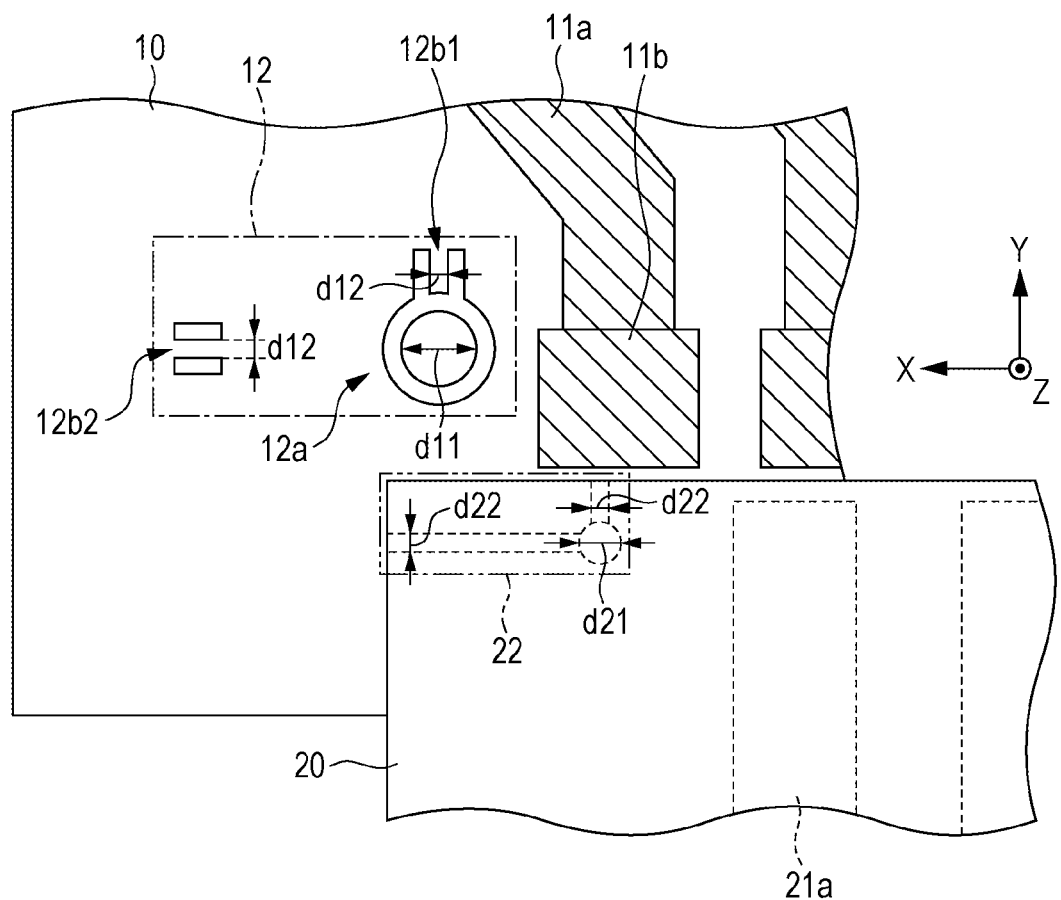
FIG. 2A is a schematic view illustrating the configuration of the alignment marks and surroundings thereof on the panel substrate and printed board shown in FIG. 1.

An embodiment of the present disclosure will now be described with reference to the drawings. The description will be given in the following order:

1. Embodiment (an exemplary electronic device module having a panel substrate with alignment marks formed from a transparent conductive film and a printed board with alignment marks formed from a metal film)
2. Variation 1 (an example in which alignment marks on the panel substrate and printed board are reversed)
3. Variation 2 (other exemplary shapes of alignment marks)
4. Variation 3 (another exemplary alignment technique)
5. Variation 4 (another exemplary alignment technique)
6. Application 1 (exemplary installation of electronic device module in liquid crystal display panel)
7. Application 2 (exemplary installation of electronic device module in organic EL display panel)
8. Application 3 (exemplary installation of electronic device module in touch panel)
9. Applications 4 to 8 (exemplary electronic apparatus)

Embodiment

[Configuration]

FIG. 1 schematically shows the configuration of main components of an electronic device module according to an embodiment (electronic device module 1). The electronic device module 1 has a printed board 20 mounted on a part of a panel substrate 10. In the embodiment of the present disclosure, the panel substrate 10 is a specific example of a "first substrate" and the printed board 20 is a specific example of a "second substrate". In this specification, the terms "transparent" and "opaque" mean "transparent" and "opaque" in a visible region, i.e., to visible light. The "visible region" corresponds to the entirety or part of the wavelengths visible to human eyes, of approximately 360 to 830 nm, for example.

The panel substrate 10 is made of a glass substrate, for example, and forms a part of a liquid crystal display device, organic EL display device, or touch panel, for example, which will be described later. The panel substrate 10 has a rectangular surface, for example, and the printed board 20 is bonded to a peripheral region thereof. On the panel substrate 10, a wiring layer 11 and alignment marks 12 for alignment with the printed board 20 are provided.

The wiring layer 11 includes a plurality of wirings 11a led out of various semiconductor devices (not shown) such as a pixel driving circuit provided on the panel substrate 10, for example, each wiring 11a being electrically connected to a wiring layer 21 (wiring 21a) formed on the printed board 20. The wiring layer 11 is made of a transparent conductive film, for example; more specifically, it is made of a monolayer film including a single layer of ITO (indium tin oxide), AZO (aluminum-doped zinc oxide), or GZO (gallium-doped zinc oxide), or made of a laminated film including two or more layers.

The alignment marks 12 (first alignment marks) are transparent; more specifically, they are transparent to light of wavelengths in the visible region of the electromagnetic spectrum, i.e., at least some of the wavelengths in the range described above. The alignment marks 12 are formed from a transparent conductive film, for example. Preferably, the alignment marks 12 are formed from the same transparent conductive film as the wiring layer 11. This allows the wiring layer 11 and the alignment marks 12 to be formed in the same process, if the wiring layer 11 is made of a transparent conductive film, for example. More specifically, after a transparent conductive film of ITO, for example, is deposited over the entire surface of the panel substrate 10 by sputtering, for example, photolithography and etching may be conducted using a layout pattern for the wiring layer 11 and a photomask corresponding to the shape (described later) of the alignment marks 12. This allows the wiring layer 11 and alignment marks 12 to be formed simultaneously from the same transparent conductive film. The alignment marks 12 are located in regions facing the alignment marks 22 provided on the printed board 20, for example, and have shapes that totally or partially engage with the corresponding alignment marks 22, for example, for higher alignment accuracy. A specific configuration of the alignment marks 12 will be described later.

The printed board 20 has an integrated circuit, resistors, capacitors, or other electronic components (not shown) provided on a substrate, for example, and is used as a wiring connecting member for mounting these electronic components on the panel substrate 10, i.e., for wiring them to semiconductor devices on the panel substrate 10. The printed board 20 is a flexible printed circuit (FPC) board having a wiring layer 21 formed on an insulative film of polyimide, for example. The wiring layer 21 includes a plurality of wirings 21a, for example. These wirings 21a are provided on the surface facing the panel substrate 10 and formed from an opaque conductive film of copper (Cu), for example. The wirings 21a are electrically connected to the wirings 11a provided on the panel substrate 10.

Instead of being provided on the surface facing the panel substrate 10, the wiring layer 21 may extend through via holes and be provided on the surface of the printed board 20 not facing the panel substrate 10. Alternatively, the wiring layer 21 may be provided on both surfaces of the printed board 20 instead of only one surface. Although this exemplary configuration includes a set of alignment marks 12, 22 provided at two locations corresponding to corners of the printed board 20, the positions and number of alignment marks are not particularly limited but depend on the wiring layouts or other conditions of the panel substrate 10 and printed board 20.

The printed board 20 has alignment marks 22 to be engaged with the alignment marks 12 described above. The alignment marks 22 are located on the surface facing the panel substrate 10, for example, and are formed from an opaque metal film, for example. More specifically, the alignment marks 22 are made of the same material (copper, for example) as the wiring layer 21 and are formed simultaneously with the wiring layer 21 in the same process. Specific configurations of the alignment marks 22 and the above alignment marks 12 will be described below.

(Alignment Marks 12, 22)

Figure 2B:
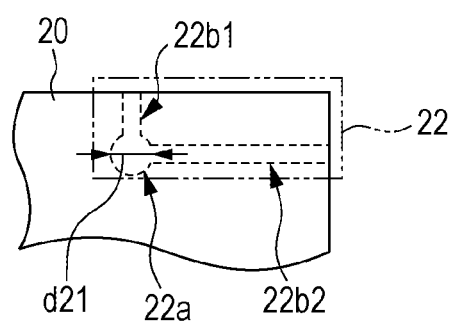
FIG. 2B is a schematic view illustrating the configuration of the alignment mark on the printed board shown in FIG. 1.
Figure 3:
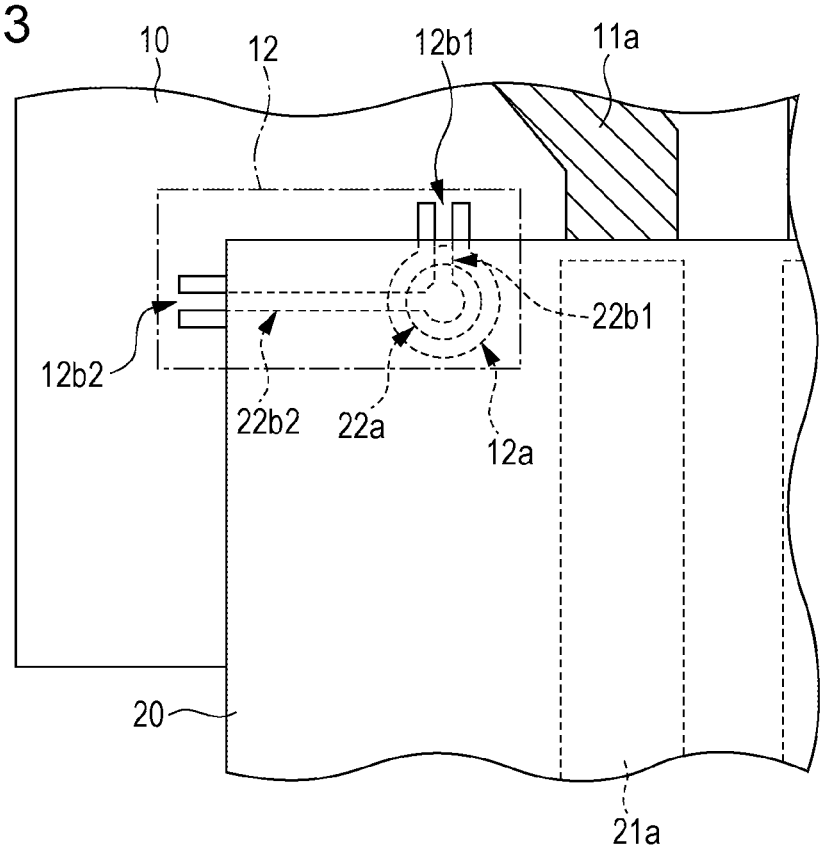
FIG. 3 is an enlarged plan view schematically showing the configuration of the alignment marks and surroundings thereof shown in FIG. 1.

FIG. 2A is a schematic view illustrating an exemplary configuration of the alignment marks 12, 22 and surroundings thereof on the panel substrate 10 and printed board 20; FIG. 2B shows the alignment mark 22 as viewed from the panel substrate 10. FIG. 3 is an enlarged plan view schematically showing the configuration of the alignment marks 12, 22 and surroundings thereof in FIG. 1. As shown in FIG. 2A, the panel substrate 10 has, in addition to the wiring layer 11 and alignment marks 12, pads for connecting wirings (connection pads 11b), for example, that electrically connect the plurality of wirings 11a to the wirings 21a on the printed board 20.

The alignment marks 12 each include an annular-shaped mark (annular portion 12a) and groove-shaped marks each having a unidirectionally extending groove (groove portions 12b1, 12b2), for example. The annular portion 12a has a circular aperture with a diameter d11 equal to or larger than the diameter d21 of the circular portion 22a (described later) of the alignment mark 22, for example. The groove portions 12b1, 12b2 are located adjacent (connected) to or spaced apart from the annular portion 12a. Here, the groove portion 12b1 is connected to the annular portion 12a, while the groove portion 12b2 is distanced from the annular portion 12a. The groove portions 12b1, 12b2 each include two rectangular marks disposed in parallel with a predetermined space (groove width) therebetween, for example. The width d12 of each of the groove portions 12b1, 12b2 is equal to or larger than the width d22 of the linear portions 22b1, 22b2 (described later) of the alignment mark 22, for example. The groove portions 12b1, 12b2 extend in two directions orthogonal to each other, for example. The groove portions 12b1, 12b2 protrude outward beyond edges of the printed board 20 when the printed board 20 is bonded to the panel substrate 10.

The alignment marks 22 each include a circular portion 22a and two linear portions 22b1, 22b2, for example. As shown in FIG. 3, the circular portion 22a is the portion that faces the annular portion 12a of the alignment mark 12, for example; more specifically, it is the portion that fits into the aperture of the annular portion 12a, for example. The linear portions 22b1, 22b2 are provided adjacent (connected) to or spaced apart from the circular portion 22a. Here, the linear portions 22b1, 22b2 are both connected to the circular portion 22a. The linear portions 22b1, 22b2 extend in the same directions as the corresponding groove portions 12b1, 12b2, for example. The ends of the linear portions 22b1, 22b2 spaced apart from the circular portion 22a reach edges of the printed board 20, for example. The linear portions 22b1, 22b2 may or may not face the groove portions 12b1, 12b2, as long as they extend along the groove portions 12b1, 12b2 as described above. In this example, the linear portion 22b1 is located in an area not facing the groove portion 12b1, while the linear portion 22b2 is partially located in an area facing the groove portion 12b2 so as to fit into the groove portion 12b2.

In the above configuration, the alignment marks 12, 22 are aligned with each other such that the circular portion 22a of the alignment mark 22 faces the annular portion 12a of the alignment mark 12 and fits into the aperture of the annular portion 12a and the linear portions 22b1, 22b2 face and fit into the groove portions 12b1, 12b2. This suppresses positional shifts in the x and y directions and rotations around the axis in the z direction (controls the rotational angle θ), for example. Controlling the x, y, and θ in this manner enables highly accurate alignment. When the printed board 20 is bonded to the panel substrate 10, the groove portions 12b1, 12b2 protrude outward beyond edges of the printed board 20 and the linear portions 22b1, 22b2 reach edges of the printed board 20. This provides good visibility during alignment and improves alignment accuracy.

[Alignment Techniques]

Figure 4:
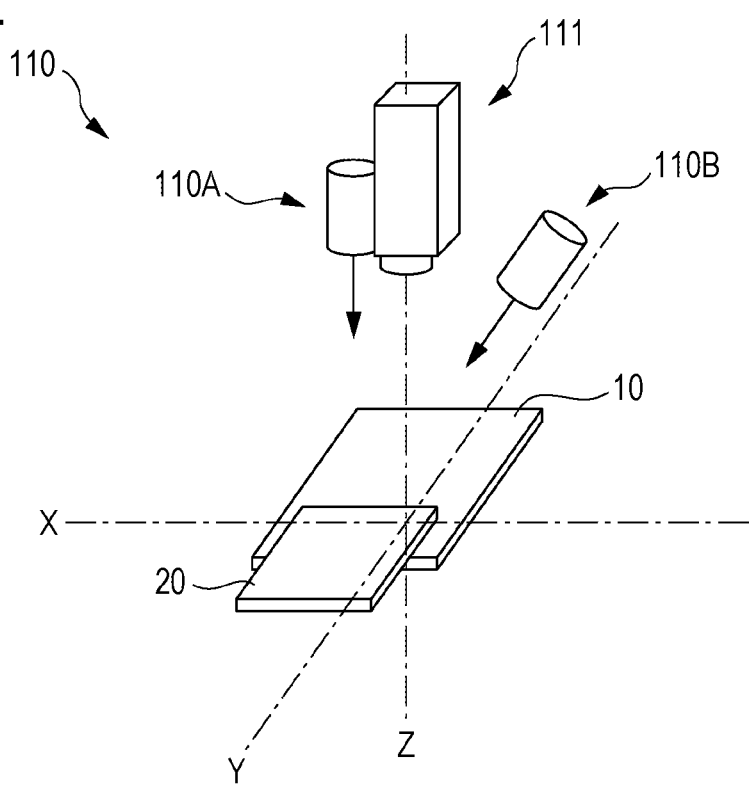
FIG. 4 is a schematic view illustrating illumination optics used for alignment.

The panel substrate 10 and printed board 20 are aligned with each other with reference to the alignment marks 12, 22 as described above such that the wiring layers 11, 21 are electrically connected, and then soldered, for example, to each other. When aligning the panel substrate 10 with the printed board 20, illumination optics 110 as shown in FIG. 4, for example, may be used.

The illumination optics 110 include two light sources 110A, 110B oriented in different directions and a camera 111 and emit light (visible light, such as white light, for example) to the panel substrate 10 and the printed board 20 placed thereon from above the printed board 20. Of the two light sources 110A, 110B, the light source 110A is installed so as to provide frontal illumination to the panel substrate 10 and printed board 20 placed in an xy plane by directing light along the z axis. The light source 110B is installed so as to provide oblique illumination to the panel substrate 10 and printed board 20 placed in the xy plane by directing light in a direction inclined relative to the z axis.

The light sources 110A, 110B are used during alignment of the alignment mark 22 provided on the printed board 20 with the alignment mark 12 provided on the panel substrate 10.

More specifically, both light sources 110A, 110B are turned on to provide frontal and oblique illumination during alignment.

Figure 5:
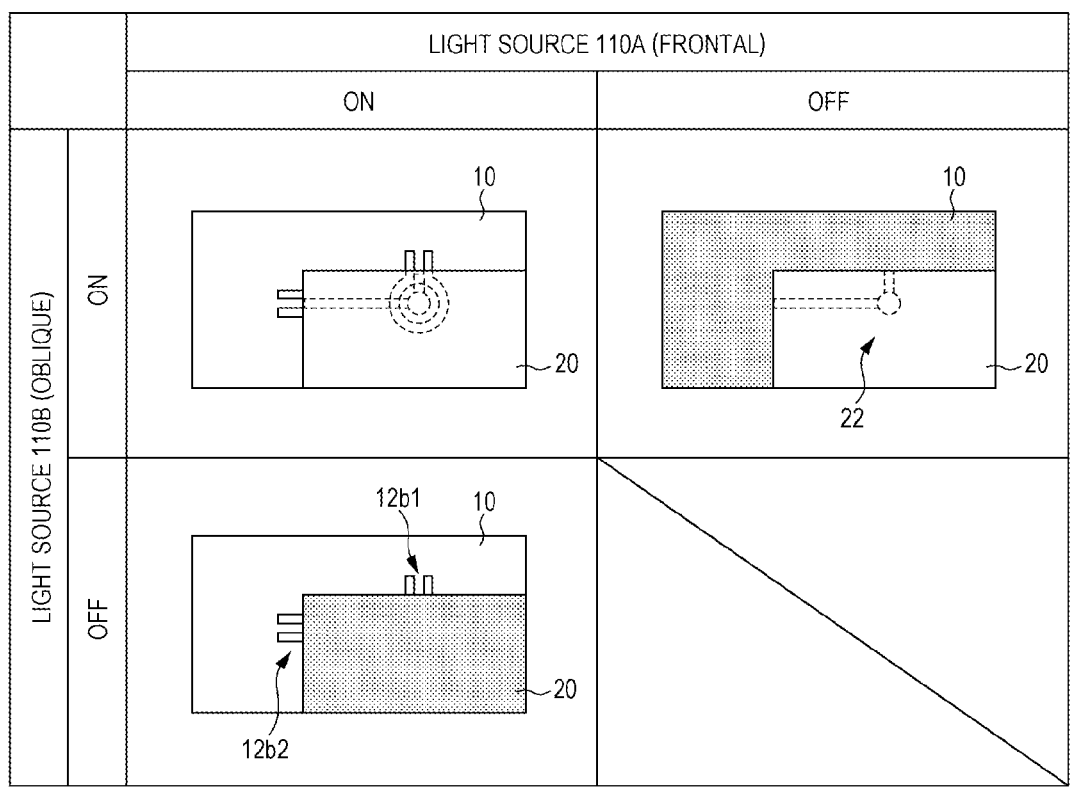
FIG. 5 is a schematic view showing visible images when illuminated by the illumination optics shown in FIG. 4.

FIG. 5 schematically shows images that are visible when the light source 110A (frontal) and light source 110B (oblique) are turned on (lit) or off (unlit). Note that these images are viewed from above the printed board 20 and the portions indicated by dotted lines are visible through the printed board 20.

As shown in FIG. 5, when only frontal illumination is provided with the light source 110A turned on and the light source 110B turned off, the groove portions 12b1, 12b2 of the alignment marks 12 on the panel substrate 10, i.e., portions not facing the printed board 20, become visible. On the other hand, the region in which the printed board 20 overlaps the panel substrate 10 is shaded and the annular portions 12a of the alignment marks 12, i.e., portions facing the printed board 20, and the alignment marks 22 on the printed board 20 itself become hardly visible.

Instead, when only oblique illumination is provided with the light source 110A turned off and the light source 110B turned on, the alignment marks 22 on the printed board 20 become visible through the printed board 20. On the other hand, the region of the panel substrate 10 not facing the printed board 20 is shaded and the alignment marks 12 on the panel substrate 10 become hardly visible.

Alternatively, when frontal and oblique illumination is provided with both the light sources 110A, 110B turned on, the panel substrate 10 and printed board 20 are not shaded and the alignment marks 12, 22 become entirely visible.

Figure 6A:
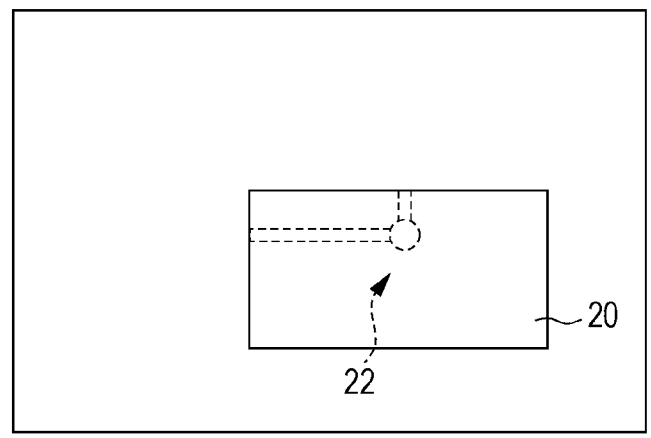
FIG. 6A is a schematic view showing a visible image when only the printed board is placed and illuminated.
Figure 6B:
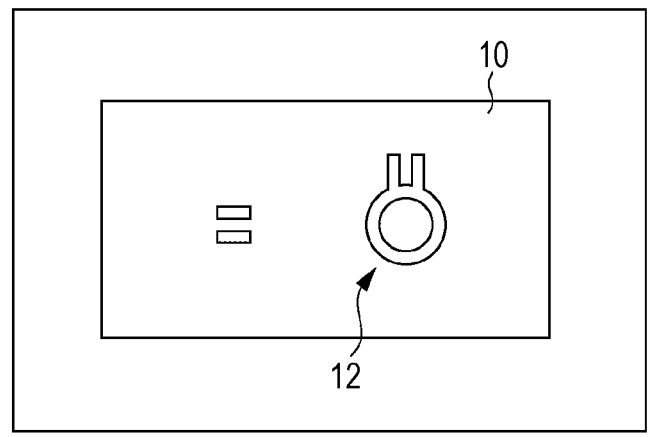
FIG. 6B is a schematic view showing a visible image when only the panel substrate is placed and illuminated.

FIG. 6A shows an image visible when only the printed board 20 is placed and illuminated with only oblique illumination, while FIG. 6B shows an image visible when only the panel substrate 10 is placed and illuminated with only frontal illumination. Thus, the alignment marks 22 on the printed board 20 are visible under the oblique illumination and the alignment marks 12 on the panel substrate 10 are visible under the frontal illumination.

The illumination optics 110, when used during alignment, provide good visibility of the alignment marks 12, 22 and facilitate alignment.

Effects

As described above, the electronic device module 1 according to the present embodiment allows the printed board 20 to be aligned with the panel substrate 10 making use of the transparent alignment marks 12 on the panel substrate 10 when the printed board 20 is mounted on the panel substrate 10. This enables the realization of an electronic device module suitable to mount electronic components on a panel formed from a transparent conductive film, for example, such as a liquid crystal display panel, organic EL display panel, or touch panel, which will be described later.

For example, when the alignment marks 12 are formed from the same transparent conductive film as the wiring layer 11, the wiring layer 11 and alignment marks 12 can be simultaneously formed in the same process. The illumination optics 110 providing frontal and oblique illumination as described above provide good visibility and facilitate alignment even if the alignment marks 12 are transparent.

When the alignment marks 12, 22 are shaped so as to engage with each other, the alignment accuracy can be enhanced. For example, the alignment marks 12 are each provided with annular portion 12a and groove portions 12b1, 12b2, while the alignment marks 22 are each provided with the circular portion 22a and linear portions 22b1, 22b2 that can fit into the annular portion 12a and groove portions 12b1, 12b2. This suppresses relative positional offset between the panel substrate 10 and the printed board 20, such as shift of the printed board 20 from a desired position in the xy plane and rotation around the z axis, for example, and thus enables accurate alignment.

With the printed board 20 bonded to the panel substrate 10, the groove portions 12b1, 12b2 protrude outward beyond edges of the printed board 20 and the linear portions 22b1, 22b2 reach the edges of the printed board 20. This provides good visibility during alignment and thus improves alignment accuracy.

Variations (variations 1 to 4) of the above embodiment will now be described. Variations 1, 2 relate to other exemplary configurations of the alignment marks, while variations 3, 4 relate to other exemplary alignment techniques. The same components as the above embodiment will be denoted with the same reference characters and description thereof will be omitted as appropriate.

<Variation 1>

Figure 7:
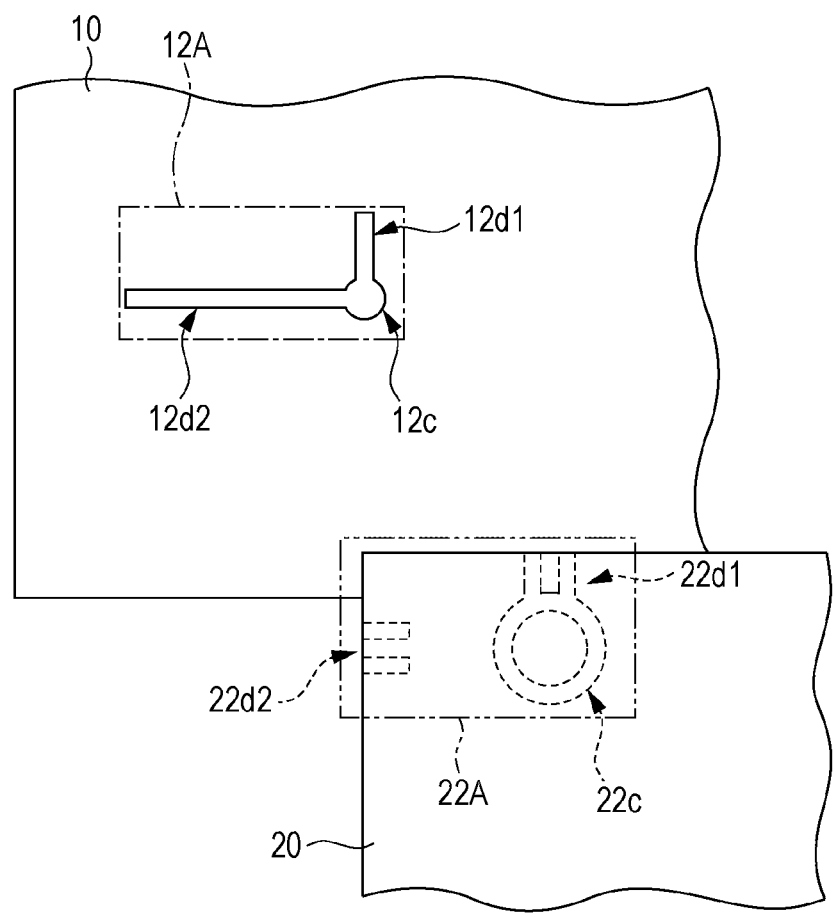
FIG. 7 is a schematic plan view showing the configuration of alignment marks according to variation 1.

FIG. 7 schematically shows the configuration of alignment marks (alignment marks 12A, 22A) according to variation 1. In this variation, the alignment marks on the panel substrate 10 and printed board 20 have a configuration reversed from the configuration of the alignment marks in the above embodiment. More specifically, the alignment marks 12A on the panel substrate 10 have a configuration similar to the alignment marks 22 on the printed board 20 in the above embodiment, while the alignment marks 22A on the printed board 20 have a configuration similar to the alignment marks 12 on the panel substrate 10 in the above embodiment.

For example, the alignment marks 22A provided together with the wiring layer 21 (not shown in FIG. 7), etc. on the printed board 20 are opaque and formed from the same metal film as the wiring layer 21. The alignment marks 22A on the printed board 20 each include an annular-shaped mark (annular portion 22c) and groove-shaped marks each having a unidirectionally extending groove (groove portions 22d1, 22d2), for example. The annular portions 22c each have a circular aperture with a diameter equal to or larger than the diameter of the circular portion 12c (described later) of the alignment mark 12A, for example. The groove portions 22d1, 22d2 are located adjacent (connected) to or spaced apart from the annular portion 22c. Here, the groove portion 22d1 is connected to the annular portion 22c, while the groove portion 22d2 is distanced from the annular portion 22c. The groove portions 22d1, 22d2 each include two rectangular marks disposed in parallel with a predetermined space (groove width) therebetween. The width of each of the groove portions 22d1, 22d2 is equal to or larger than the width of the linear portions 12d1, 12d2 (described later) of the alignment mark 12A, for example. The groove portions 22d1, 22d2 extend in two directions orthogonal to each other, for example. The ends of the groove portions 22d1, 22d2 spaced apart from the annular portion 22c reach edges of the printed board 20, for example.

On the other hand, the alignment marks 12A provided together with the wiring layer 11, connection pads (not shown in FIG. 7), etc. on the panel substrate 10 are transparent and formed from the same transparent conductive film as the wiring layer 11, for example. The alignment marks 12A on the panel substrate 10 each include a circular portion 12c and two linear portions 12d1, 12d2, for example. The circular portion 12c is the portion that faces the annular portion 22c of the alignment mark 22A, for example; more specifically, it is the portion that fits into the aperture of the annular portion 22c, for example. The linear portions 12d1, 12d2 are located adjacent (connected) to or spaced apart from the circular portion 12c. Here, the linear portions 12d1, 12d2 are both connected to the circular portion 12c. The linear portions 12d1, 12d2 extend in the same directions as the groove portions 22d1, 22d2 facing them, for example. The linear portions 12d1, 12d2 protrude outward beyond edges of the printed board 20 when the printed board 20 is bonded to the panel substrate 10. The linear portions 12d1, 12d2 may or may not face the groove portions 22d1, 22d2, as long as they extend along the corresponding groove portions 22d1, 22d2 as described above. In this variation, the linear portions 12d1, 12d2 are located in a region partially facing the groove portion 22d2 so as to fit into the groove portion 22d2.

In such a configuration as described above, the annular portion 22c of the alignment mark 22A faces the circular portion 12c of the alignment mark 12A such that the circular portion 12c fits into the aperture of the annular portion 22c, for example, to enable alignment in the x and y directions. On the other hand, the linear portions 12d1, 12d2 of the alignment mark 12A face the corresponding groove portions 22d1, 22d2 of the alignment mark 22A such that the linear portions 12d1, 12d2 fit into the corresponding groove portions 22d1, 22d2 to suppress the rotation around the z axis by controlling the rotational angle θ. Controlling the x, y, and θ in this manner enables highly accurate alignment.

As in this variation, the shapes of the alignment marks 12A, 22A may have shapes reversed from the shapes of the alignment marks 12, 22 in the above embodiment. This variation can provide the same effects as the above embodiment.

<Variation 2>

Figure 8A:
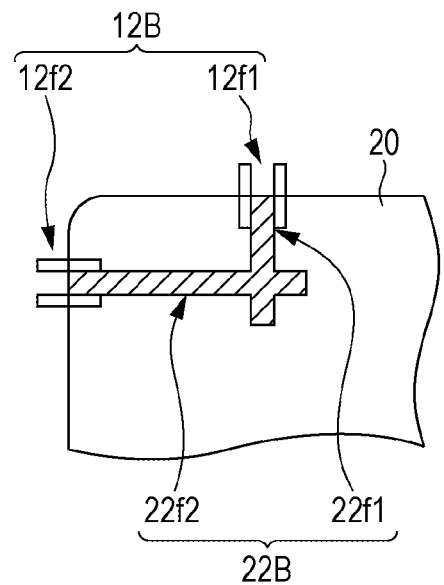
FIG. 8A is a schematic sectional view showing the configuration of alignment marks according to variation 2-1.
Figure 8B:
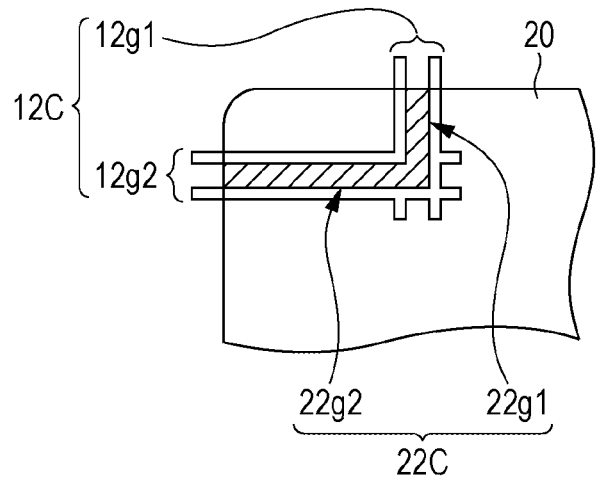
FIG. 8B is a schematic sectional view showing the configuration of alignment marks according to variation 2-2.
Figure 8C:
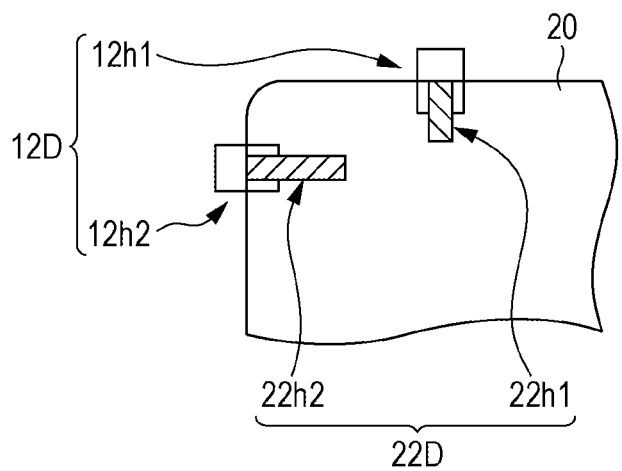
FIG. 8C is a schematic sectional view showing the configuration of alignment marks according to variation 2-3.

FIGS. 8A to 8C show exemplary configurations of alignment marks according to variation 2 (variations 2-1 to 2-3). For simplicity, FIGS. 8A to 8C show only the shapes of the alignment marks and a part of the printed board 20. The alignment marks on the printed board 20 are illustrated by hatching. In the variations 2-1 to 2-3, the alignment marks 12B to 12D on the panel substrate 10 do not have the annular portion 12a provided in the above embodiment and the alignment marks 22B to 22D on the printed board 20 do not have the circular portion 22a provided in the above embodiment. Such an exemplary configuration will now be described in detail.

(Variation 2-1)

As shown in FIG. 8A, the alignment mark 12B has two groove portions 12f1, 12f2 extending in two directions orthogonal to each other. The groove portions 12f1, 12f2 are distanced from each other and only partially face linear portions 22f1, 22f2 described later. The groove portions 12f1, 12f2 protrude outward beyond edges of the printed board 20. The corresponding two linear portions 22f1, 22f2 of the alignment mark 22B extend along the above groove portions 12f1, 12f2. The linear portions 22f1, 22f2 intersect with each other, forming a cross as a whole.

(Variation 2-2)

As shown in FIG. 8B, the alignment mark 12C has two groove portions 12g1, 12g2 extending in two directions orthogonal to each other. The groove portions 12g1, 12g2 intersect with each other so as to be connected with each other at a single point and are shaped so as to face the entirety of linear portions 22g1, 22g2 described later. The groove portions 12g1, 12g2 protrude outward beyond edges of the printed board 20. The corresponding two linear portions 22g1, 22g2 of the alignment mark 22C extend along the above groove portions 12g1, 12g2. The linear portions 22g1, 22g2 are connected with each other in a L-shape as a whole.

(Variation 2-3)

As shown in FIG. 8C, the alignment mark 12D has two groove portions 12h1, 12h2 extending in two directions orthogonal to each other. The groove portions 12h1, 12h2 have angular U-shaped contours and face parts of linear portions 22h1, 22h2 described later. The groove portions 12h1, 12h2 protrude outward beyond edges of the printed board 20. The corresponding two linear portions 22h1, 22h2 of the alignment mark 22D extend along the above groove portions 12h1, 12h2. In this variation, the linear portions 22h1, 22h2 are distanced from each other.

As in the above variations 2-1 to 2-3, the alignment marks may not have such an annular portion and circular portion as described above. The groove portions extending in two directions, for example, and the corresponding linear portions can suppress positional shifts in the xy plane and rotations around the z axis and enable alignment at an accuracy substantially equivalent to the above embodiment.

In the above embodiment, the visibility of the alignment marks is improved by providing frontal and oblique illumination during alignment; alignment can also be achieved by subjecting captured images to a predetermined process and confirming the positions of the alignment marks as in the following variations 3 and 4.

<Variation 3>

Figure 9A:
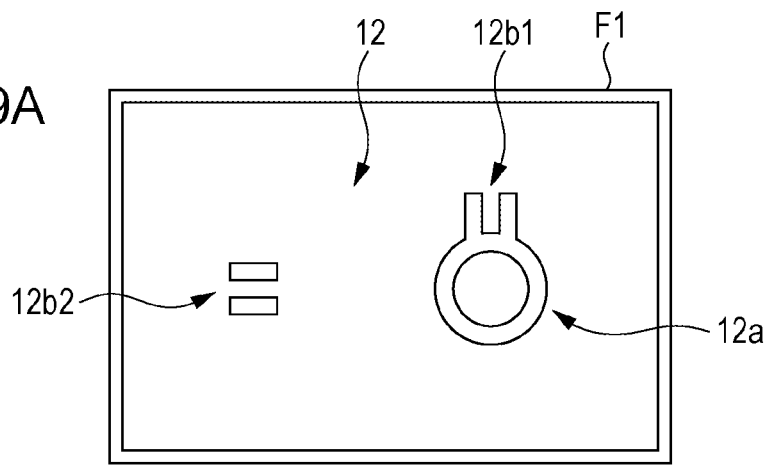
FIG. 9A is a schematic view illustrating an alignment technique according to variation 3.
Figure 9B:
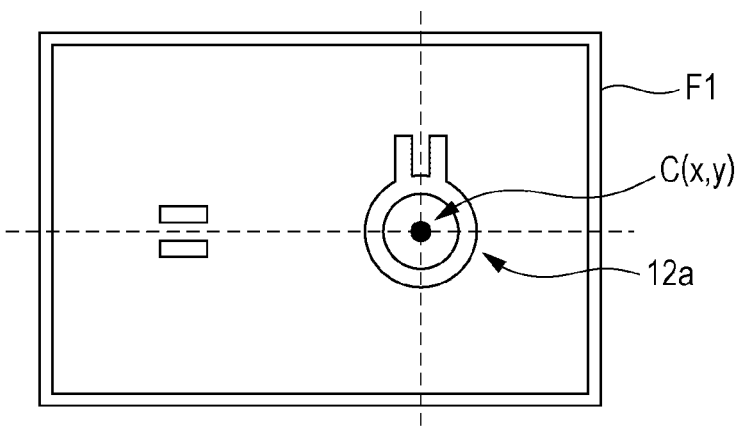
FIG. 9B is a schematic view illustrating the alignment technique according to variation 3.
Figure 9C:
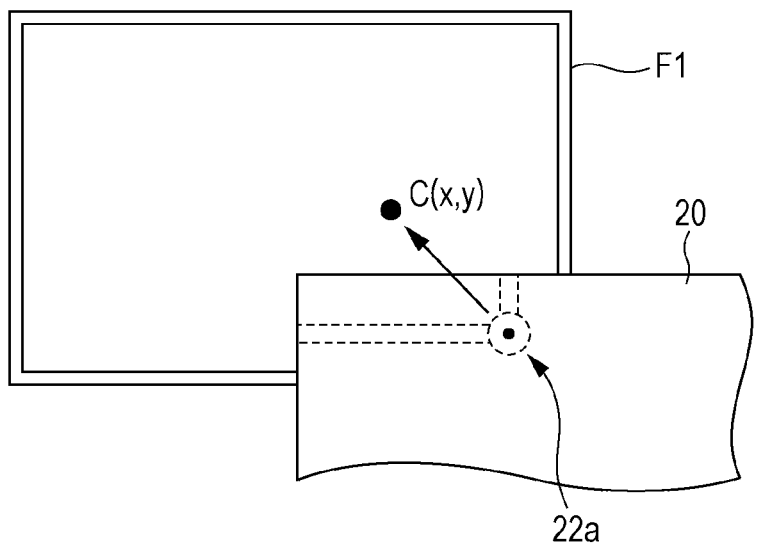
FIG. 9C is a schematic view illustrating the alignment technique according to variation 3.

FIGS. 9A to 9C are schematic views illustrating an alignment technique according to variation 3. Description will be given citing the alignment marks 12, 22 in the above embodiment. First, the alignment mark 12 on the panel substrate 10 is photographed as shown in FIG. 9A. More specifically, with only the panel substrate 10 placed under oblique illumination as shown in FIG. 6B by turning on only the light source 110B of the illumination optics 110 shown in FIG. 4, an image of the alignment mark 12 is captured using the camera 111. Although the image may be captured under frontal illumination using only the light source 110A, a better result can be obtained when the light source 110B is used. Subsequently, the position of the alignment mark 12 (position of the center (C(x, y)) of the annular portion 12a, for example) is extracted in a geometrical manner, for example, on the basis of the captured image as shown in FIG. 9B. Then, with the position of the camera 111 fixed, the extracted position C is displayed on the shooting screen F1 as shown in FIG. 9C, and the printed board 20 is placed on the panel substrate 10 such that the circular portion 22a on the printed board 20 is superimposed on the position C. Although the alignment mark 12 including the annular portion 12a and groove portions 12b1, 12b2 and the alignment mark 22 including the circular portion 22a and linear portions 22b1, 22b2 are described here for illustrative purposes, the alignment technique according to this variation enables alignment without using the groove portions 12b1, 12b2 and linear portions 22b1, 22b2. This means that alignment can be achieved using only the annular portion 12a and circular portion 22a.

<Variation 4>

Figure 10A:
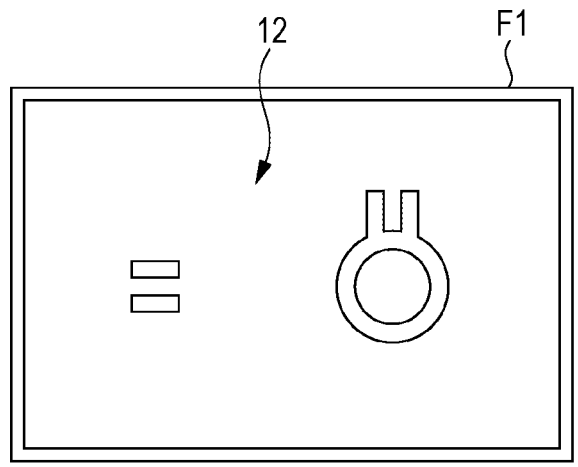
FIG. 10A is a schematic view illustrating an alignment technique according to variation 4.
Figure 10B:
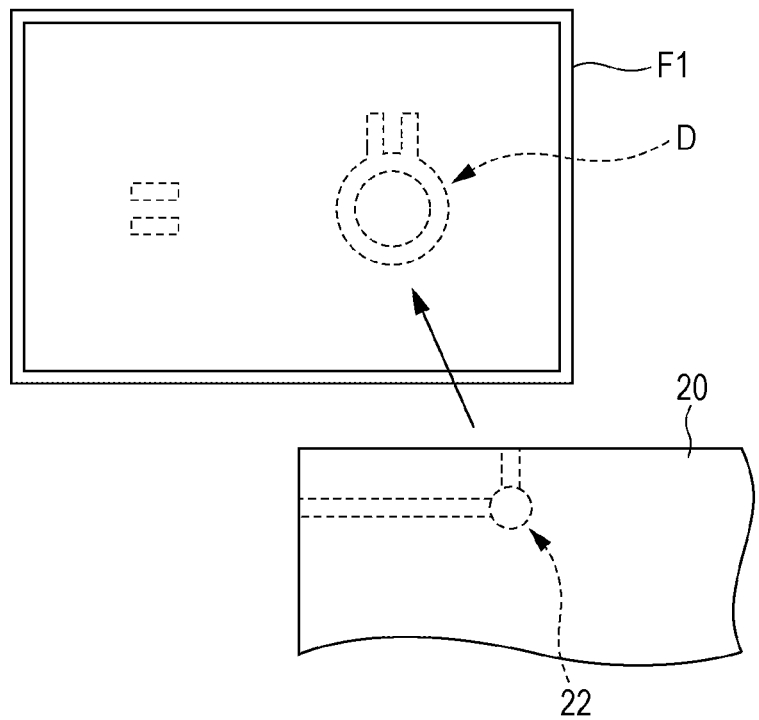
FIG. 10B is a schematic view illustrating the alignment technique according to variation 4.

FIGS. 10A and 10B are schematic views illustrating an alignment technique according to variation 4. Description will be given again citing the alignment marks 12, 22 in the above embodiment. First, the alignment mark 12 on the panel substrate 10 is photographed as shown in FIG. 10A. More specifically, as in the above variation 3, by placing only the panel substrate 10 and turning on only the light source 110A of the illumination optics 110 shown in FIG. 4, for example, an image of the alignment mark 12 is captured using the camera 111. Then, with the position of the camera 111 fixed and with only the light source 110B turned on to provide only oblique illumination, a semi-transparent image D of the captured image of the alignment mark 12 is displayed on the shooting screen F1 and the printed board 20 is placed on the panel substrate 10 such that the alignment mark 22 on the printed board 20 is superimposed on the semi-transparent image D as shown in FIG. 10B.

Applications 1 to 8 of the electronic device module described in the above embodiment and variations 1 to 4 will now be described. Applications 1 to 3 relate to exemplary panels into which the electronic device module is incorporated and applications 4 to 8 relate to exemplary electronic apparatus.

<Application 1>

Figure 11:
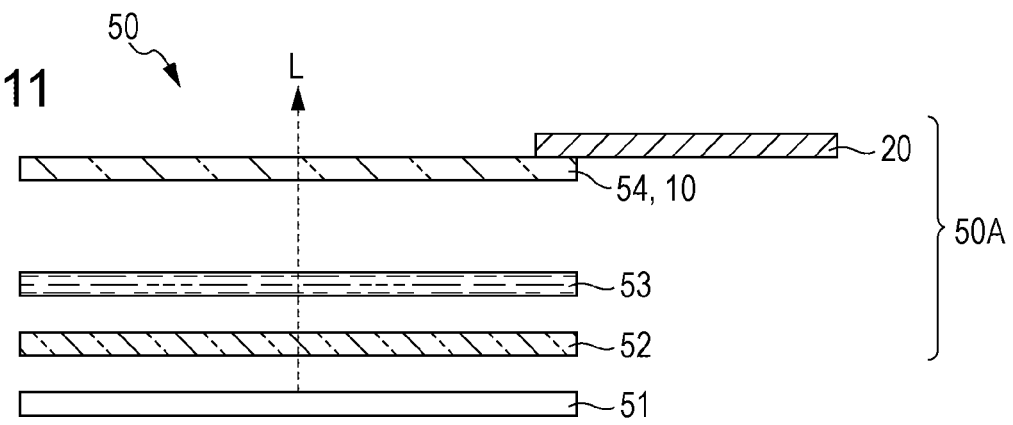
FIG. 11 is a schematic sectional view showing a liquid crystal display device according to application 1.
Figure 12:
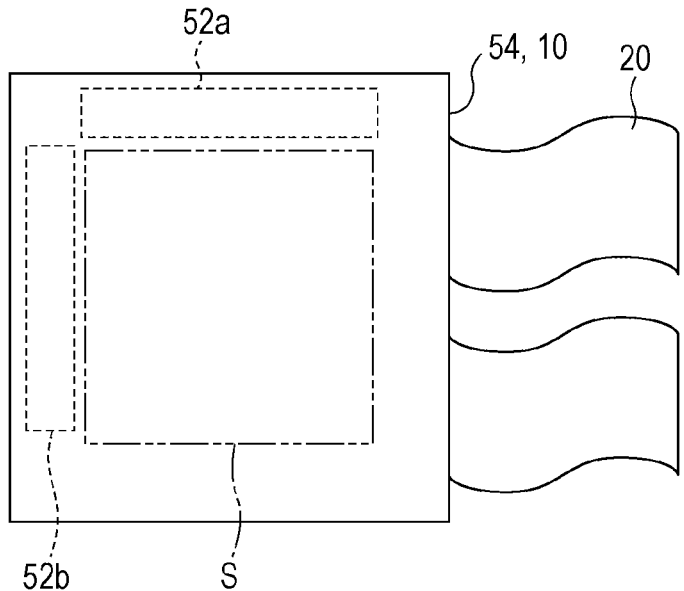
FIG. 12 is a schematic plan view showing the general structure of the liquid crystal display panel shown in FIG. 11.

FIG. 11 is a schematic sectional view of main components of a liquid crystal display device according to application 1 (liquid crystal display device 50). The liquid crystal display device 50 includes a liquid crystal display panel 50A and a backlight 51. The liquid crystal display panel 50A includes a TFT substrate 52, a CF substrate 54, and a liquid crystal layer 53 sealed therebetween. In such a configuration, illumination light from the backlight 51 is modulated in accordance with a video signal in the liquid crystal display panel 50A and displayed as video light above the CF substrate 54 described later. FIG. 12 is a plan view showing the configuration of the liquid crystal display panel 50A.

The backlight 51 is a light source emitting light toward the liquid crystal display layer 53 and includes a plurality of LEDs (light emitting diodes), CCFLs (cold cathode fluorescent lamps), etc., for example. The backlight 51 is driven by a backlight driving unit (not shown) to control the lit and unlit states of the backlight 51.

In the liquid crystal display panel 50A, a plurality of pixels (R (red), G (green), and B (blue) subpixels, for example) are arranged in a matrix in an effective display area S, for example. On the TFT substrate 52, a pixel electrode is provided for each pixel, and a peripheral circuitry for driving the pixels for display, including a signal line-driving circuit 52a, scanning line-driving circuit 52b, etc., for example, is provided in the periphery (frame area) surrounding the effective display area S. A timing control unit, backlight driving unit, and a video signal processing circuit (not shown) for subjecting the video signal, for example, to a predetermined correction process are also provided on the TFT substrate 52. The scanning line-driving circuit 52b line-sequentially drives the pixels at a predetermined timing, while the signal line-driving circuit 52a supplies a video voltage to the pixels on the basis of the video signal.

On the CF substrate 54, color filters and a black matrix are provided, for example, in addition to a counter electrode common to each pixel. On the CF substrate 54, the counter electrode and wiring layer are formed from a transparent conductive film such as ITO, for example. The panel substrate 10 described above can preferably be used as the CF substrate 54. More specifically, in the liquid crystal display panel 50A, the printed board 20 is mounted on the light emission surface of the CF substrate 54. The CF substrate 54 may protrude outward beyond an edge of the TFT substrate 52, for example, and the printed board 20 may be mounted on the surface of this protruding area of the CF substrate 54 facing the liquid crystal layer 53.

More specifically, alignment marks 12 as described above are provided on the CF substrate 54. In this case, when the counter electrode is formed from a transparent conductive film, the transparent conductive film may be patterned in the frame area, for example, with a predetermined shape as described above, i.e., including the annular portions 12a and groove portions 12b1, 12b2, for example.

Figure 13:
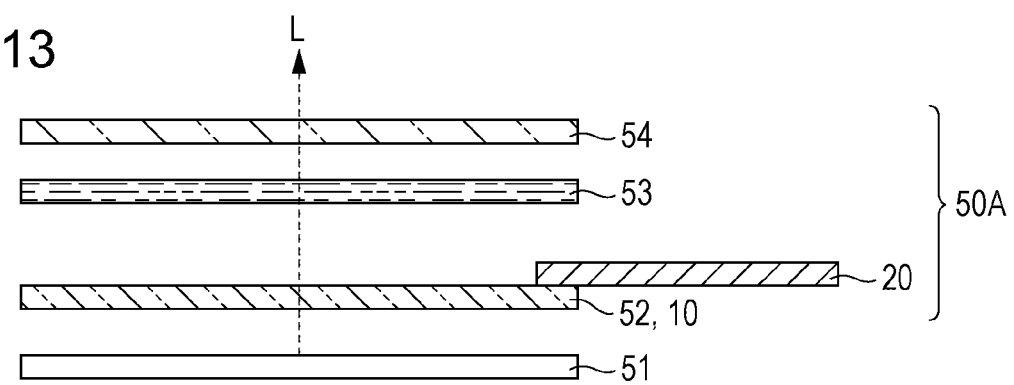
FIG. 13 is a schematic sectional view showing another liquid crystal display device according to application 1.

Note that the panel substrate 10 described above is not limited to such a CF substrate 54, but may be any substrate that forms part of the liquid crystal display panel 50A. The panel substrate 10 may be formed from the TFT substrate 52, for example, as shown in FIG. 13. The surface on which the printed board 20 is mounted is not limited to a particular surface and may be either one of the principal surfaces of the panel substrate 10. Alternatively, the printed board 20 may be mounted on both principal surfaces, i.e., front and back of the panel substrate 10.

<Application 2>

Figure 14A:
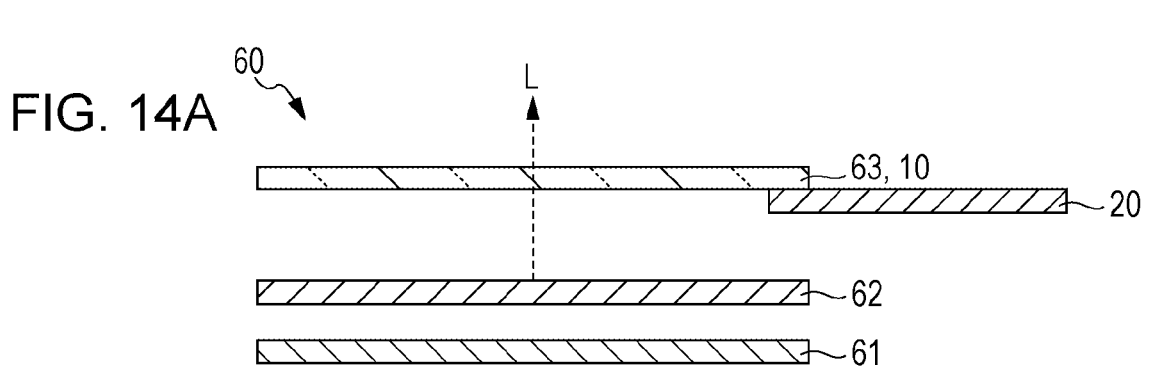
FIG. 14A is a schematic sectional view showing an organic EL display device according to application 2.
Figure 14B:
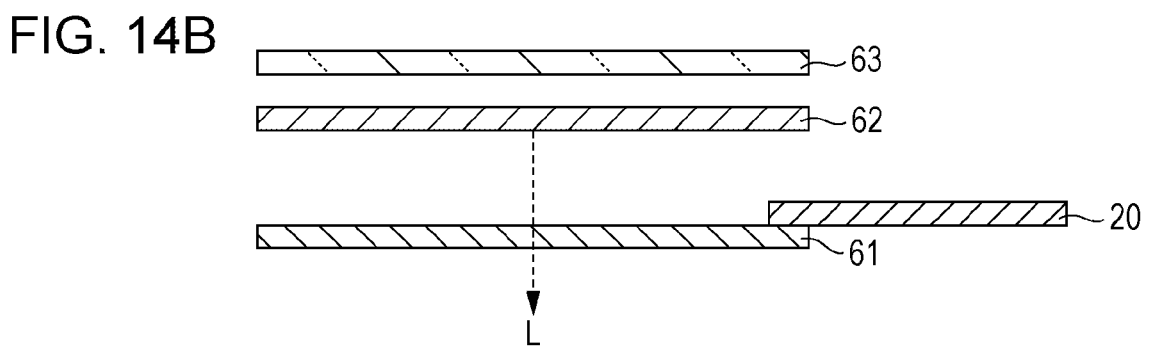
FIG. 14B is a schematic sectional view showing another organic EL display device according to application 2.

FIGS. 14A and 14B are sectional views schematically showing the configurations of main components of the organic EL display device according to application 2 (organic EL display device 60). The organic EL display device (organic EL display panel) 60 has a driving substrate 61, a sealing substrate 63, and an organic EL layer 62 sealed therebetween. In such a configuration, a drive current in accordance with the video signal is applied to the organic EL layer 62 through the driving substrate 61 to emit light. The light thus emitted is taken out as video light through the top of the sealing substrate 63 or through the bottom of the driving substrate 61. FIG. 14A shows a so-called top emission type light emitting organic EL display panel in which light is taken out through the top of the sealing substrate 63. In such an organic EL display panel, the printed board 20 may be mounted on the sealing substrate 63 as the panel substrate 10 described above. FIG. 14B shows a so-called bottom emission type organic EL display panel in which light is taken out through the bottom of the driving substrate 61. In such an organic EL display panel, the printed board 20 may be mounted on the driving substrate 61 as the panel substrate 10 described above. In the bottom emission type, where electrodes and a wiring layer are formed from a transparent conductive film on the driving substrate 61, the alignment mark 12 may be formed from this transparent conductive film.

Note that the surface on which the printed board 20 is mounted is not particularly limited and the printed board 20 may be mounted on any of the principal surfaces of the sealing substrate 63 and driving substrate 61.

<Application 3>

Figure 15A:
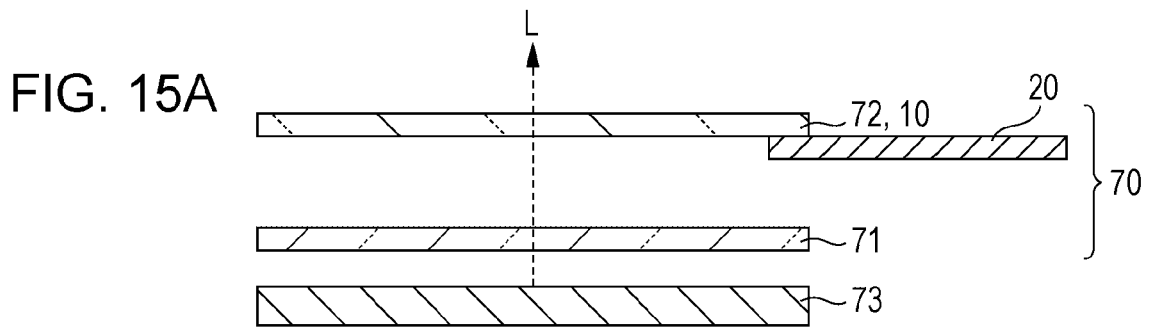
FIG. 15A is a schematic sectional view showing a touch panel according to application 3.
Figure 15B:
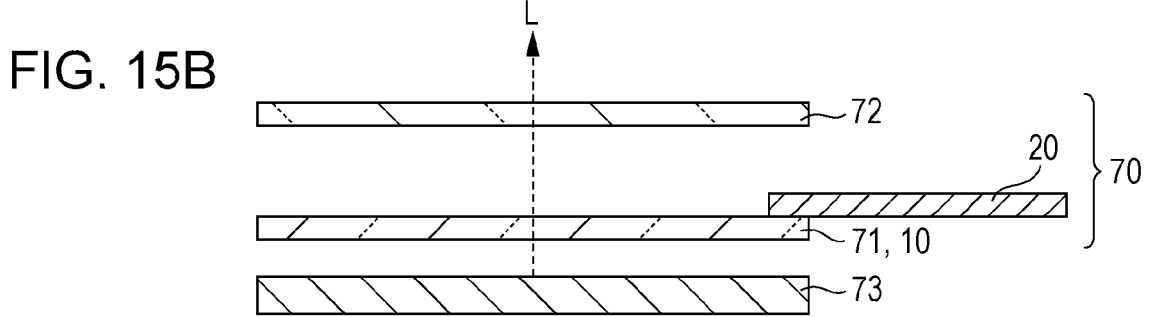
FIG. 15B is a schematic sectional view showing another touch panel according to application 3.

FIGS. 15A and 15B are sectional views schematically showing the configurations of main components of a touch panel according to application 3 (touch panel 70). The touch panel 70 is a capacitive touch panel, for example, and is externally attached to a display device 73 or the like. The touch panel 70 includes a drive-side substrate 71, a detection-side substrate 72, and a capacitive element formed therebetween, for example, and has electrodes and wirings formed from a transparent conductive film on both the drive-side substrate 71 and the detection-side substrate 72. In such a touch panel 70, the drive-side substrate 71 (FIG. 15A) or the detection-side substrate 72 (FIG. 15B) may be used as the panel substrate 10 described above. The alignment mark 12 can be formed from the transparent conductive film.

A cover glass may be bonded to a surface of such a touch panel 70, i.e., to the upper surface of the detection-side substrate 72. The printed board 20 may be mounted on this cover glass as the panel substrate 10 described above.

Referring now to FIGS. 16 to 20G, applications 4 to 8 will be described. The electronic device module 1, liquid crystal display device 50, and organic EL display device 60 according to the above embodiment, etc., are applicable to electronic apparatus in all areas, such as television apparatus, digital cameras, notebook-sized personal computers, mobile terminal devices such as mobile telephones, or video cameras. An electronic apparatus having a touch sensor function can be realized by incorporating the touch panel 70 described above as a module in such an electronic apparatus. Thus, the display apparatus according to the above embodiment, etc., are applicable to electronic apparatus in all areas that display internally generated or externally input video signals as images or videos.

(Application 4)

Figure 16:
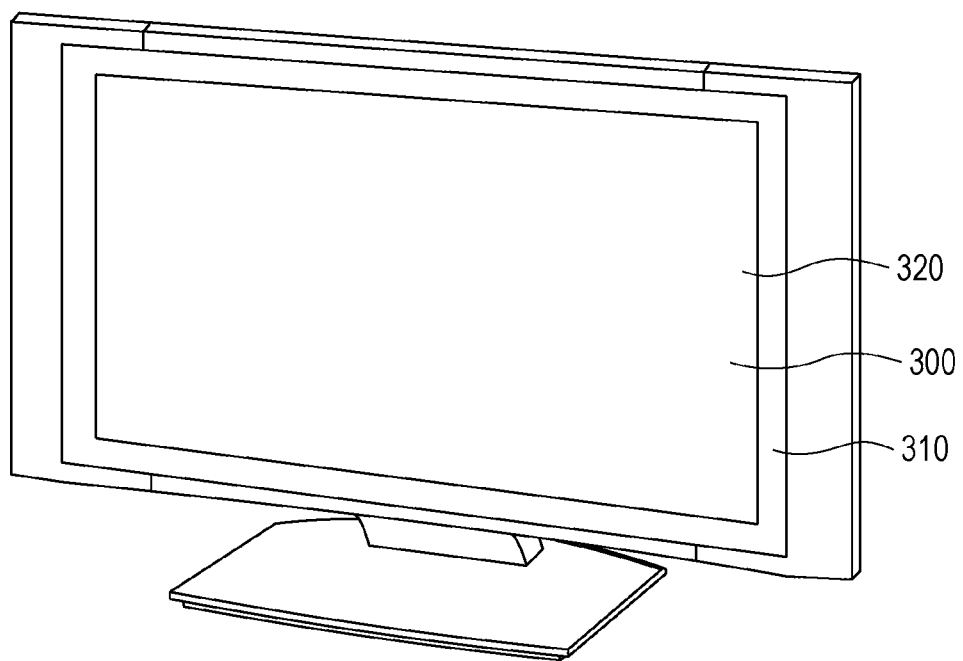
FIG. 16 is a perspective view showing application 4.

FIG. 16 is a perspective view of a television apparatus according to application 4. This television apparatus is equipped with a video display screen unit 300 including a front panel 310 and a filter glass 320, for example. The video display screen unit 300 is equivalent to the display device according to the above embodiment, etc.

(Application 5)

Figure 17A:
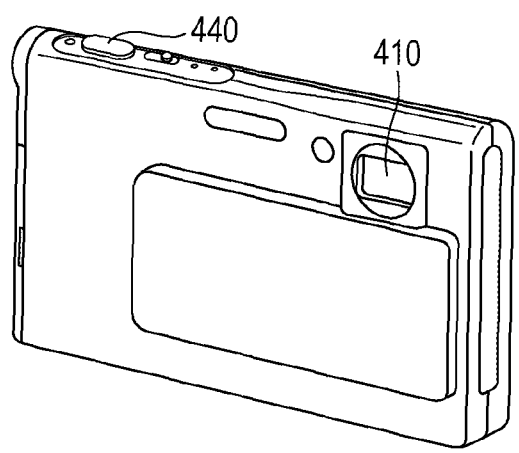
FIG. 17A is a perspective view showing the front side of application 5.
Figure 17B:
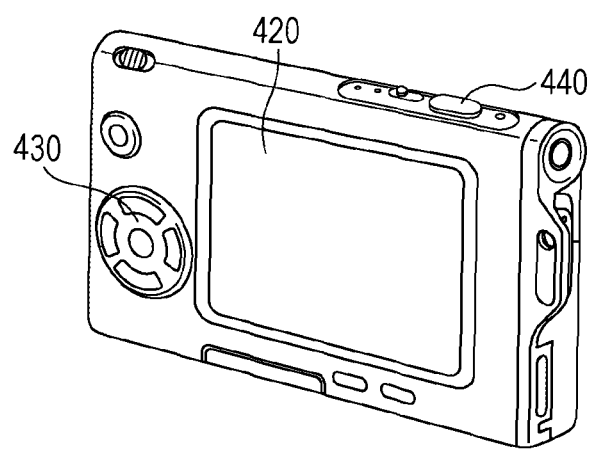
FIG. 17B is a perspective view showing the back side of application 5.

FIGS. 17A and 17B are perspective views of a digital camera according to application 5. This digital camera is equipped with a flash light emitting unit 410, display unit 420, menu switch 430, and shutter button 440, for example. The display unit 420 is equivalent to the display device according to the above embodiment, etc.

(Application 6)

Figure 18:
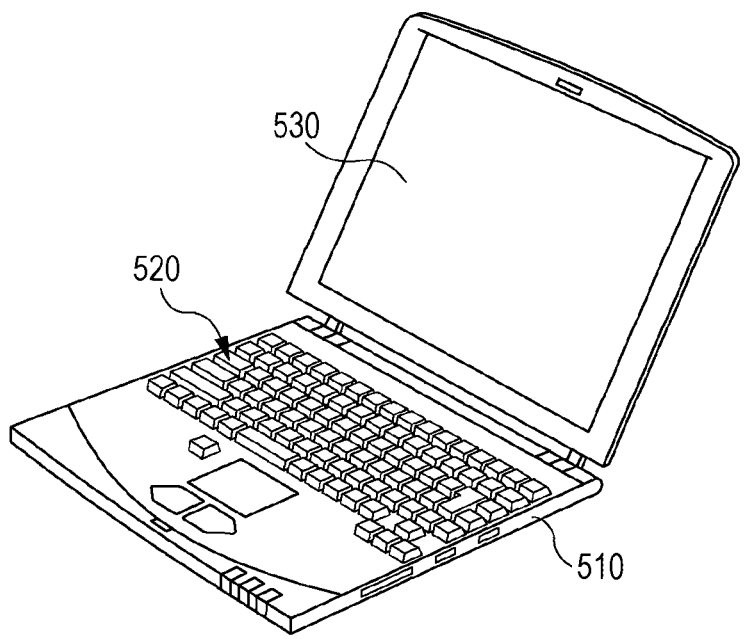
FIG. 18 is a perspective view showing application 6.

FIG. 18 is a perspective view of a notebook-sized personal computer according to application 6. This notebook-sized personal computer is equipped with a main body 510, keyboard 520 for inputting characters, etc., and a display unit 530 for displaying images, for example. The display unit 530 is equivalent to the display device according to the above embodiment, etc.

(Application 7)

Figure 19:
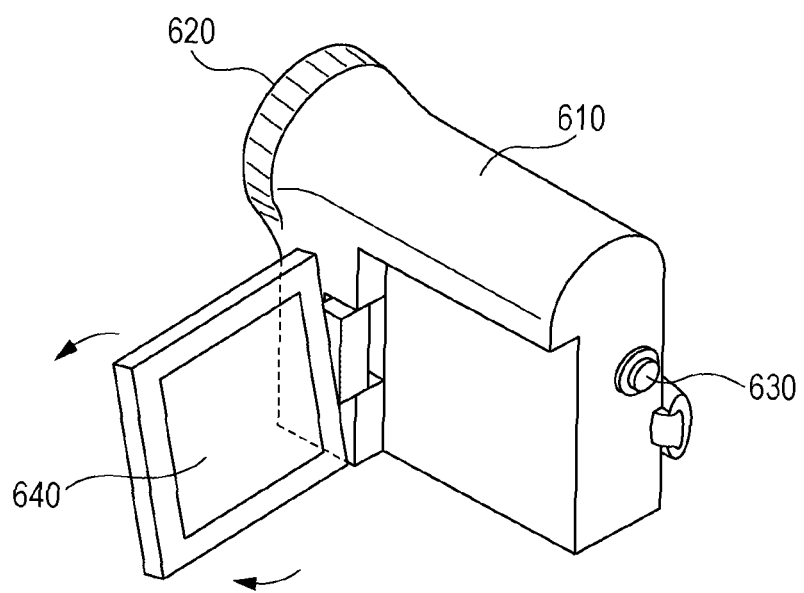
FIG. 19 is a perspective view showing application 7.

FIG. 19 is a perspective view of a video camera according to application 7. This video camera has a main body 640, a lens 620 provided on the front side of the main body 610 for photographing the subject, a photographing start/stop switch 630, and a display unit 640, for example. The display unit 640 is equivalent to the display device according to the above embodiment, etc.

(Application 8)

FIGS. 20A to 20G are perspective views of a mobile telephone according to application 8. This mobile telephone has an upper casing 710 and a lower casing 720 connected with each other by a connection unit (hinge unit) 730, for example, as well as a display 740, subdisplay 750, picture light 760, and a camera 770. The display 740 or subdisplay 750 is equivalent to the display device according to the above embodiment, etc.

The present disclosure has been described citing the embodiment, variations, and applications, but the present disclosure is not limited to the above embodiment, etc., and various variations may be made to the present disclosure. For example, the alignment mark 22 provided on the surface of the printed board 20 facing the panel substrate 10 in the above embodiment, etc., may be provided on the surface of the printed board 20 not facing the panel substrate 10.

Although in the above embodiment, etc., specific shapes of the alignment marks provided on the panel substrate and printed board are described for illustrative purposes, these alignment marks are not limited to the shapes described above and may adopt various shapes. For example, a configuration with a circular mark fitting into a circular aperture of an annular portion has been described by way of example in the above embodiment, etc., but the mark may not necessarily be circular in shape and may be polygonal such as square.

The embodiment of the present disclosure may have a configuration as described in items (1) to (13) below:

(1) An electronic device module including a first substrate having a first wiring layer and a first alignment mark transparent in a visible region of the electromagnetic spectrum, and a second substrate partially facing the first substrate and having a second wiring layer and a second alignment mark facing the first alignment mark;

(2) The electronic device module according to item (1) above, wherein the second alignment mark is opaque in the visible region of the electromagnetic spectrum;
(3) The electronic device module according to item (1) or (2) above, wherein the first and second alignment marks are formed from conductive films;
(4) The electronic device module according to any one of items (1) to (3) above, wherein the first wiring layer and the first alignment mark are formed from a conductive film and the second wiring layer and the second alignment mark are formed from another conductive film;
(5) The electronic device module according to any one of items (1) to (4) above, wherein the first and second alignment marks engage with each other;
(6) The electronic device module according to any one of items (1) to (5) above, wherein one of the first and second alignment marks has an annular portion and the other alignment mark has a circular portion that fits into the region surrounded by the annular portion;
(7) The electronic device module according to any one of items (1) to (6) above, wherein one of the first and second alignment marks has one or more groove portions and the other alignment mark has a linear portion extending in the same direction as the one or more groove portions;
(8) The electronic device module according to any one of items (1) to (7) above, wherein two of each of the groove portions and the linear portions are provided and the two groove portions intersect each other in a plane parallel to the substrate surface;
(9) The electronic device module according to any one of items (1) to (8) above, wherein the first alignment mark has the groove portions and the second alignment mark has the linear portions, the groove portions extending on the first substrate and protruding outward beyond an edge of the second substrate;
(10) The electronic device module according to any one of items (1) to (9) above, wherein the first substrate is a panel substrate forming at least a part of a touch panel or display panel and the second substrate is a printed board;
(11) The electronic device module according to any one of items (1) to (10) above, wherein the first substrate forms a part of the touch panel;
(12) The electronic device module according to item (10) above, wherein the display panel has a liquid crystal display element and a counter substrate as the first substrate in this order on a pixel driving substrate; and
(13) The electronic device module according to item (10) above, wherein the display panel has an organic electroluminescent element and a sealing substrate in this order on the pixel driving substrate, the first substrate being the pixel driving substrate or sealing substrate located on the light emitting side.

The present disclosure contains subject matter related to that disclosed in Japanese Priority Patent Application JP 2011-110722 filed in the Japan Patent Office on May 17, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device module comprising:
   a first substrate having a first wiring layer and a first alignment mark, the first alignment mark being transparent in a visible region of the electromagnetic spectrum; and
   a second substrate facing a part of the first substrate and having a second wiring layer and a second alignment mark that is opaque in the visible region of the electromagnetic spectrum and faces the first alignment mark, the second substrate being placed on the first substrate disposed on an X-Y plane,
   wherein the first alignment mark is configured to, from a second substrate side, be visible by illumination in a Z direction and be invisible by illumination in an inclined direction relative to the Z direction, and
   wherein the second alignment mark is configured to, from the second substrate side, be visible by illumination in the inclined direction and be invisible by illumination in the Z direction.

2. The electronic device module according to claim 1, wherein the first and second alignment marks are formed from a conductive film.

3. The electronic device module according to claim 2, wherein the first wiring layer and the first alignment mark are formed from the same conductive film and the second wiring layer and the second alignment mark are formed from the same conductive film.

4. The electronic device module according to claim 1, wherein the first and second alignment marks engage with each other.

5. The electronic device module according to claim 4, wherein one of the first and second alignment marks has an annular portion;
   wherein the other alignment mark has a circular portion fitting into a region surrounded by the annular portion.

6. The electronic device module according to claim 4, wherein one of the first and second alignment marks has one or more groove portions;
   wherein the other alignment mark has a linear portion extending along the one or more groove portions.

7. The electronic device module according to claim 6, wherein two of each of the groove portions and the linear portions are provided;
   wherein the two groove portions intersect each other in a plane parallel to a substrate surface.

8. The electronic device module according to claim 6, wherein the first alignment mark has the groove portion and the second alignment mark has the linear portion;
   wherein the groove portion extends on the first substrate and protrudes outward beyond an edge of the second substrate.

9. The electronic device module according to claim 1, wherein the first substrate is a panel substrate forming at least a part of a touch panel or display panel;
   wherein the second substrate is a printed board.

10. The electronic device module according to claim 9, wherein the first substrate forms a part of the touch panel.

11. The electronic device module according to claim 9, wherein the display panel has, on a pixel driving substrate in this order:
    a liquid crystal display element; and
    a counter substrate as the first substrate.

12. The electronic device module according to claim 9, wherein the display panel has an organic electroluminescent element and a sealing substrate in this order on a pixel driving substrate;
    wherein the first substrate is the pixel driving substrate or the sealing substrate on a light emitting side.

13. A method of producing an electronic device module, the electronic device module including a first substrate having a first wiring layer and a first alignment mark, the first alignment mark being transparent in a visible region of the electromagnetic spectrum, and a second substrate facing a part of the first substrate and having a second wiring layer and a second alignment mark that faces the first alignment mark and that is opaque in the visible region, the method comprising:

placing the second substrate on the first substrate disposed on an X-Y plane;

illuminating the first substrate and the second substrate by a first light source that directs light in a Z direction and by a second light source that directs light in an inclined direction inclined relative to the Z direction;

taking an image of the first alignment mark and the second alignment mark that are illuminated by the first light source and the second light source; and aligning the first substrate and the second substrate based on the image including the first alignment mark and the second alignment mark.

14. The method of claim 13, wherein:

the first alignment mark is configured to, from a second substrate side, be visible by illumination in a Z direction and be invisible by illumination in an inclined direction inclined relative to the Z direction, and the second alignment mark is configured to, from a second substrate side, be visible by illumination in the inclined direction and be invisible by illumination in the Z direction.

* * * * *